United States Patent [19]
Evans, Jr. et al.

[11] Patent Number: 5,440,173
[45] Date of Patent: Aug. 8, 1995

[54] HIGH-TEMPERATURE ELECTRICAL CONTACT FOR MAKING CONTACT TO CERAMIC MATERIALS AND IMPROVED CIRCUIT ELEMENT USING THE SAME

[75] Inventors: Joseph T. Evans, Jr.; Jeff A. Bullington, both of Albuquerque, N. Mex.

[73] Assignee: Radiant Technologies, Albuquerque, N. Mex.

[21] Appl. No.: 123,289

[22] Filed: Sep. 17, 1993

[51] Int. Cl.⁶ ............................................. H01L 29/43
[52] U.S. Cl. .................................... 257/751; 437/246; 437/190; 437/192; 257/295; 257/764; 257/769; 257/915
[58] Field of Search ................ 437/190, 201, 192, 246; 257/295, 751, 753, 763, 764, 915, 767, 769

[56] References Cited

U.S. PATENT DOCUMENTS

| | | |
|---|---|---|
| 3,879,746 | 4/1975 | Fournier . |
| 4,673,593 | 6/1987 | Himoto . |
| 5,122,477 | 6/1992 | Wolters et al. . |
| 5,382,817 | 1/1995 | Kashihara et al. .................. 257/295 |

FOREIGN PATENT DOCUMENTS 56-26478  3/1981  Japan .

OTHER PUBLICATIONS

S. Kanamori, et al. "Supression of Platinum Penetration Failure . . . " *Thin Solid Films* 110 (1983) pp. 205–213.

*Primary Examiner*—Olik Chaudhuri
*Assistant Examiner*—C. Everhart
*Attorney, Agent, or Firm*—Calvin B. Ward

[57] ABSTRACT

A method for connecting a silicon substrate to an electrical component via a platinum conductor. The resulting structure may be heated in the presence of oxygen to temperatures in excess of 800° C. without destroying the electrical connection between the silicon substrate and components connected to the platinum conductor. The present invention utilizes a TiN or TiW buffer layer to connect the platinum conductor to the silicon substrate. The buffer layer is deposited as a single crystal on the silicon substrate. The platinum layer is then deposited on the buffer layer. The region of the platinum layer in contact with the buffer layer is also a single crystal.

4 Claims, 3 Drawing Sheets

HIGH-TEMPERATURE ELECTRICAL CONTACT FOR MAKING CONTACT TO CERAMIC MATERIALS AND IMPROVED CIRCUIT ELEMENT USING THE SAME

FIELD OF THE INVENTION

The present invention relates to integrated circuits, and more particularly, to an improved system for making electrical contact to silicon substrates in which the contact must withstand high temperatures in the presence of oxygen.

BACKGROUND OF THE INVENTION

As memory densities increase, memories utilizing ceramic dielectrics become increasingly attractive because of the high dielectric constants provided by ceramics such as lead zirconate titanate (PZT). For example, in DRAMs, the data is stored as a charge on a capacitor. The length of time between refresh cycles is determined by the size of the capacitor. As the size of the memory cell is reduced, the size of the capacitor must also be reduced, thereby leading to a decrease in the time interval between refresh cycles. To maintain reasonable intervals between refresh cycles, the capacitance of the capacitors must be increased without increasing the physical size of the capacitors. The simplest method for obtaining higher capacitance is to use a dielectric medium with an increased dielectric constant.

In prior art systems, the memory capacitors and transistors are fabricated separately, both in time and space. The capacitors and transistors are then connected together during the standard CMOS metalization steps. While this method works adequately for memories up to 64 Mbytes, resulting cell size is too large to allow a cost effective memory to be made at higher densities.

To obtain higher densities, the ferroelectric capacitor must be built with the bottom electrode of the capacitor connected directly to the CMOS transistor. This geometry saves a significant amount of space, since the source of the transistor and the capacitor can be built in the same space. This fabrication technique requires the capacitor electrode to be in contact with the silicon structures of the source or the drain during the subsequent deposition of the ceramic dielectric and the sintering operations following that deposition. The temperatures involved in these steps together with the need to have oxygen present lead to the oxidation of the silicon structures. These oxidation reactions lead to high resistance regions that destroy the contact efficiency.

Broadly, it is the object of the present invention to provide an improved contact system for use in making connections to silicon structures that can withstand high temperatures in the presence of oxygen.

It is a further object of the present invention to provide an improved contact system for use in connecting ceramic capacitors directly to the gate or drain of a CMOS transistor.

These and other objects of the present invention will become apparent to those skilled in the art from the following detailed description of the invention and the accompanying drawings.

SUMMARY OF THE INVENTION

The present invention comprises a method for connecting a silicon substrate to an electrical component via a platinum conductor. The resulting structure may be heated in the presence of oxygen to temperatures in excess of 800° C. without destroying the electrical connection between the silicon substrate and components connected to the platinum conductor. The present invention utilizes a TiN or TiW buffer layer to connect the platinum conductor to the silicon substrate. The buffer layer is deposited as a single crystal on the silicon substrate. The platinum layer is then deposited on the buffer layer. The region of the platinum layer in contact with the buffer layer is also a single crystal.

DETAILED DESCRIPTION OF THE INVENTION

Figure 1:
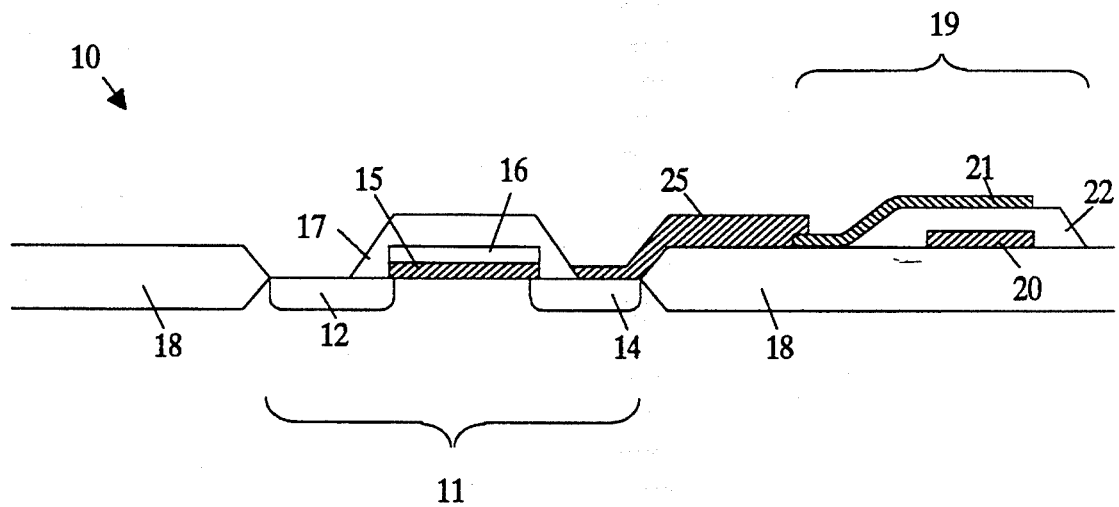
FIG. 1 is a cross-sectional view of a prior art arrangement of a CMOS transistor connected to a capacitor having a ceramic dielectric.

The manner in which the present invention gains its advantages may be more easily understood with reference to a prior art structure having a capacitor 19 connected to a CMOS transistor 11 as shown in FIG. 1 at 10. Transistor 11 includes a drain 12, gate region comprising gate oxide 15 and gate electrode 16 and a source 14. The gate structures are isolated with the aid of a glass layer 17. Prior to constructing transistor 11, capacitor 19 is constructed by depositing a first electrode 20 on a thermal oxide layer 18. A layer 22 of ceramic material such as PZT is deposited over electrode 20 and then sintered to form a thin film dielectric. A top electrode is then deposited on layer 22. The top and bottom electrodes are typically constructed from platinum or a conductive metal oxide. Bottom electrode 20 is typically constructed by first depositing a glue material such as Titanium onto which the platinum is deposited. After capacitor 11 is completed, source 14 is connected to top electrode 22 by a metal layer 25. Since capacitor 19 occupies a different region of the silicon substrate from that occupied by transistor 11, the area of a cell having both transistor 11 and capacitor 19 is larger than would be the case if capacitor 19 were built over transistor 11.

Figure 2:
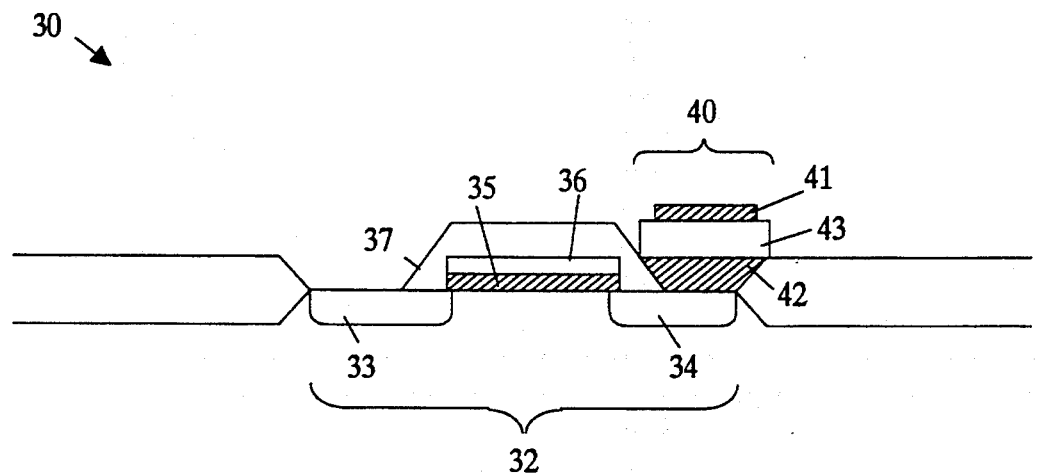
FIG. 2 is a cross-sectional view of a transistor having a capacitor built over, and in contact with, the source thereof.

Refer now to FIG. 2 which illustrates the manner in which a capacitor 40 can, in principle, be built over the source 34 of a transistor 32. Cell 30 is constructed by first constructing a CMOS transistor 32 having a drain 33, gate region consisting of gate oxide 35 and gate electrode 36, and source 34. The gate structures are insulated with a glass layer 37. A capacitor 40 is then constructed by depositing a bottom electrode 42 on source 34. A ceramic layer 43 is then deposited and sintered. Finally, the top electrode 41 is deposited.

Structures such as that shown in FIG. 2 have been suggested in the literature. However, no metal or oxide structure has been demonstrated that allows a satisfactory bottom electrode to be constructed. For example, if platinum is deposited on the silicon of source 34, oxygen passes through the platinum layer during the sintering of ceramic layer 43 and oxidizes the silicon at the interface with source 34. This leads to a high resistance region which has reduced structural integrity as well as increased resistance. The reduced structural integrity often results in the entire capacitor structure separating from the source because of the stresses associated with the thermal expansion miss-match between the ceramic, bottom layer, and source.

The addition of a glue layer such as the titanium layer described above does not solve these problems. The titanium reacts and diffuses into the silicon as well as oxidizes during the high temperature sintering of the ceramic layer. The oxides cause high resistance problems as well as reduced structural integrity.

The problems encountered in prior attempts at constructing platinum electrodes in contact with silicon have resulted from the diffusion of oxygen through the platinum layer. The present invention is based on the observation that oxygen diffusion occurs along the grain boundaries in the platinum layer. Hence, if there were no grain boundaries at the platinum interface, oxygen diffusion can be eliminated. In the present invention, this goal is achieved by utilizing a bottom electrode that is a single crystal of platinum, and hence, has no grain structure.

It can be shown that a layer of platinum that is deposited on a substrate that is a single crystal forms a single crystal. The source of the transistor is a portion of a single crystal. Hence, in principle, a layer of platinum deposited directly on the source should form a single crystal, and the above-described oxygen diffusion problems avoided. Unfortunately, platinum cannot be deposited directly on silicon. If platinum is deposited on silicon, the silicon and platinum layers diffuse into one another during the subsequent high temperature processing steps and create a diode junction. Hence, a barrier layer must be provided between the silicon and the platinum. If this barrier layer is also a single crystal, then the subsequently deposited platinum layer will also form a single crystal if the appropriate deposition conditions are utilized.

TiN or TiW may be used as a barrier layer. It should be noted that past attempts to make ferroelectric capacitors with TiN and platinum have failed because the underlying surface was amorphous silicon dioxide. The amorphous foundation leads to a polycrystalline bottom electrode structure. Oxygen diffused through the ferroelectric and platinum along the grain boundaries and reacted with the TiN or TiW causing the structure to fail. The fundamental problem with prior art barriers lies in the exposure to oxygen at high temperatures.

Figure 3:
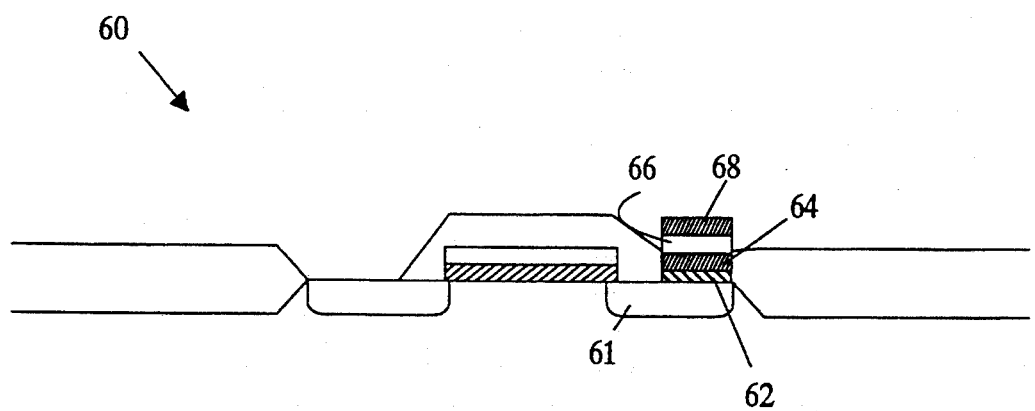
FIGS. 3 is a cross-sectional view of a transistor according to the present invention utilizing a TiN barrier layer.

Referring to FIG. 3, a capacitor according to the present invention is constructed as follows. First, the bulk CMOS circuit processing is completed through the opening of vias to the transistor source and drain contacts. A single crystal layer 62 of TiN is deposited on the source 61 by sputtering or laser ablation. A single crystal layer 64 of platinum is then deposited on the TiN layer via sputtering, laser ablation, or evaporation.

The Pt/TiN layers may be deposited using pulsed laser deposition techniques. The silicon substrate is first cleaned and etched. The substrate is cleaned using semiconductor grade acetone and methanol followed by spin etching using 10% HF solution in ethanol. This cleaning provides an oxide free silicon surface to be used for the deposition of the TiN and Pt layers.

The TiN film was deposited using stoichiometric sintered target of TiN. The silicon substrate was transferred to a high vacuum chamber after the cleaning operation described above. The silicon substrate was then heated to 700° C. in vacuum. TiN was then deposited using a 308 nm XeCl excimer laser. The Pt layer was then deposited on the TiN layer. For the deposition of the Pt thin film, the substrate was also maintained at 700° C. in vacuum. The Pt layer was deposited from a Pt target using the same excimer laser. After deposition, the substrate was cooled at a rate of 10° C./min. The thickness of the TiN and Pt layers was of the order of 500 Angstroms. The laser energy used for these depositions was 5–10 J/cm$^2$.

A layer of ferroelectric material 66 is then deposited along with any interfacial electrode materials. For example, Strontium Ruthenium Oxide (SRO) is often used to isolate the platinum electrode from PZT. In such structures, a layer of SRO is deposited on the platinum before depositing the PZT layer. A second layer of SRO is then deposited on the PZT. The SRO layer reduces the fatigue problems commonly found in ferroelectric capacitors. These materials may be deposited via laser ablation or sputtering. The SRO is deposited at a temperature of 800° C. The PZT may be deposited via sol-gel or vapor deposition techniques. The PZT is then sintered at 850° C. Finally, the second layer of SRO is deposited. To simplify the drawings the SRO layers, if any, have been omitted. The multi-layer structure is then etched into individual capacitors located over each transistor contact.

Figure 4:
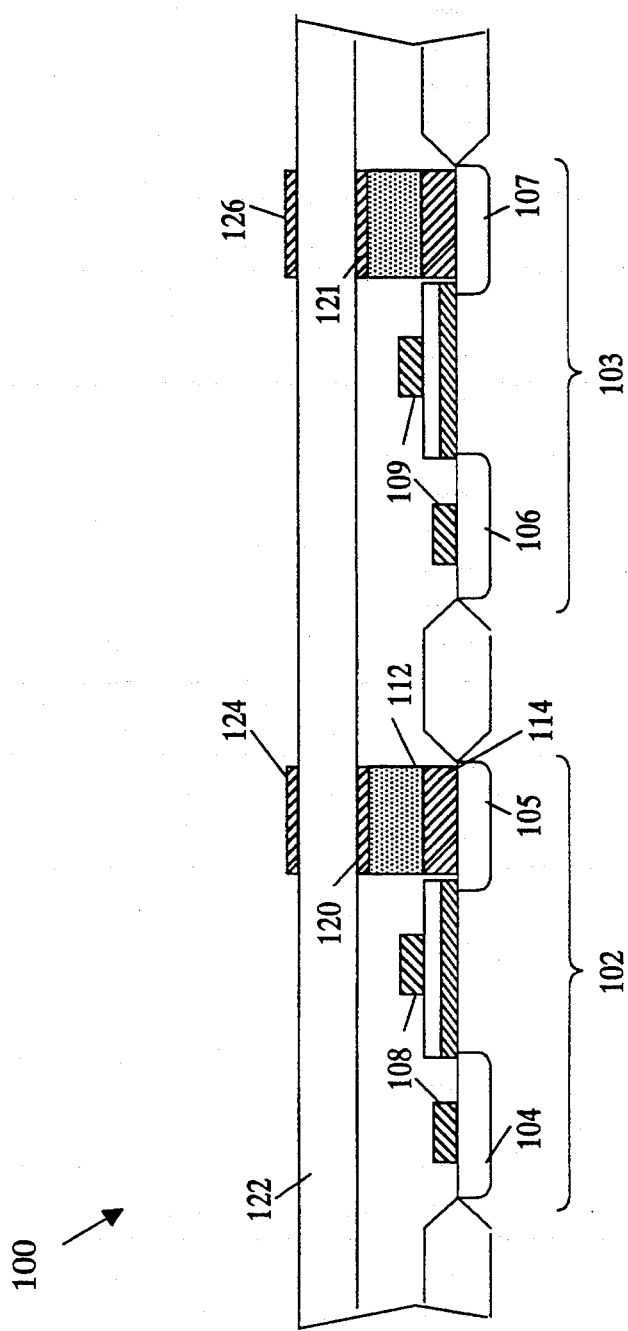
FIG. 4 is a cross-sectional view of a memory array using the present invention.

It should be noted that in multi-transistor chips such as ferroelectric memory arrays only the top SRO layer need be etched to form the top electrode of the capacitor. Refer now to FIG. 4 which is a cross-section through two FET 102 and 103 of a ferro-electric memory array according to the present invention. FET 102 has source 104 and drain 105. Similarly, FET 103 has source 106 and drain 107. The sources and gates of the FETs are connected by conductors 108 and 109 prior to fabricating the capacitors used to store the data on the drains. The conductors can be constructed from polysilicon or platinum. After the source and gate lines are connected, an insulating layer is placed over the CMOS circuitry and openings are etched therein to expose the drain regions. TiN and Platinum layers are then deposited in the openings as shown at 114 and 112, respectively. A layer 120 of SRO is then deposited and etched to form the lower electrodes 120 and 121 of the capacitors. Then a layer 122 of PZT is deposited on the entire surface of the device. Finally, an SRO layer is deposited on the PZT layer and etched to form the top electrodes of the capacitors as shown at 124 and 126. The top electrodes may then be connected by conventional metalization techniques.

The regions over the drains 105 and 107 remain as single crystal structures. That is, TiN layer 114, Pt layer 112, the portion of the SRO layer 120 overlying Pt layer 112, and the portion of the PZT layer overlying Pt layer 112 are all single crystal structures. The regions of the SRO layer 120 and PZT layer 122 which do not overlay the single crystal regions, are polycrystalline. However, these polycrystalline regions do not cause the problems discussed above, because the single crystal regions protect the sensitive structures.

The entire wafer is then covered with glass, via holes opened therein, and the aluminum interconnects deposited through the via holes. From this point, the processing of the wafer is conventional, and hence, will not be discussed in more detail here.

In the case of ferroelectric capacitors, the contact system of the present invention provides additional advantages. In non-volatile ferroelectric memories, data is stored in the remnant polarization of the PZT material. Each time the memory cell is read, the data is destroyed and must be restored. With each re-writing of the data, the difference between the polarization of the two states defining logical 1 and 0 decreases. This phenomena is referred to as fatigue. Fatigue limits the useful lifetime of non-volatile ferroelectric memories. Fatigue is substantially reduced if the ferroelectric material is a single crystal. The ferroelectric layer generated in the present invention is a single crystal when deposited on a single crystal electrode structure. Hence, the contact structure of the present invention provides substantially improved ferroelectric capacitors.

Lanthium strontium cobalt oxide(LSCO) may be used in place of SRO. The LSCO may be etched with dilute nitric acid, and hence, is preferred over SRO which requires that the material be deposited as a metal, etched, and then oxidized.

Various modifications to the present invention will become apparent to those skilled in the art from the foregoing description and accompanying drawings. Accordingly, the present invention is to be limited solely by the scope of the following claims.

What is claimed is:

1. A contact structure for connecting a circuit element to a crystalline silicon substrate, said structure comprising:
    a barrier layer of a titanium compound chosen from the group consisting of TiN and TiW bonded to said silicon substrate; and
    a layer of platinum bonded to said bonded barrier layer, wherein said barrier layer is a single crystal.

2. The contact structure of claim 1 wherein said platinum layer is a single crystal in the region bonded to said barrier layer.

3. A method for connecting an electrical component to a crystalline silicon substrate, said method comprising the steps of:
    depositing a barrier layer comprising a compound chosen from the group consisting of TiN and TiW; and
    depositing a platinum layer on said barrier layer, wherein said barrier layer is a single crystal.

4. The method of claim 3 wherein said platinum layer is a single crystal in the region bonded to said barrier layer.

* * * * *